United States Patent
Hsu et al.

(10) Patent No.: US 12,347,486 B2
(45) Date of Patent: Jul. 1, 2025

(54) FORMING METHOD OF RESISTIVE RANDOM-ACCESS MEMORY ARRAY

(71) Applicant: UNITED MICROELECTRONICS CORP., Hsinchu (TW)

(72) Inventors: Chi-Hsiu Hsu, Hsinchu County (TW); Yu-Huan Yeh, Hsinchu (TW); Cheng-Hsiao Lai, Chiayi County (TW); Guan-Lin Chen, New Taipei (TW); Chuan-Fu Wang, Miaoli County (TW); Hung-Yu Fan Chiang, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 203 days.

(21) Appl. No.: 18/201,213

(22) Filed: May 24, 2023

(65) Prior Publication Data
US 2024/0347108 A1  Oct. 17, 2024

(30) Foreign Application Priority Data
Apr. 12, 2023 (TW) ................. 112113614

(51) Int. Cl.
    *G11C 13/00* (2006.01)
(52) U.S. Cl.
    CPC ................. *G11C 13/0064* (2013.01)

(58) Field of Classification Search
CPC ........... G11C 13/0064; G11C 13/0004; G11C 2013/0073; G11C 2013/0088; G11C 13/0007; G11C 13/0061; G11C 2013/0083; G11C 13/0069
USPC ........................................... 365/148
See application file for complete search history.

(56) References Cited

U.S. PATENT DOCUMENTS

| | | | |
|---|---|---|---|
| 9,053,781 B2 | 6/2015 | Tsai et al. | |
| 9,355,722 B2 * | 5/2016 | Matsunami | G11C 13/0011 |
| 10,163,503 B2 | 12/2018 | Lee et al. | |
| 12,033,698 B2 * | 7/2024 | Molas | G11C 13/004 |

* cited by examiner

*Primary Examiner* — Amir Zarabian
*Assistant Examiner* — Minh D Dinh
(74) *Attorney, Agent, or Firm* — WPAT, PC

(57) ABSTRACT

A forming method of a ReRAM array includes steps as follows: Firstly, a first pulse is applied to a first ReRAM unit in the ReRAM array. Afterwards, a second pulse is applied to the first ReRAM unit, wherein the electrical property of the first pulse is opposite to that of the second pulse. Then, a verification pulse is applied to the first ReRAM unit to verify whether the first resistance value of the first ReRAM unit passes a preset threshold. When the first resistance value passes the preset threshold value, a third pulse is applied to the first ReRAM unit, wherein the first pulse and the third pulse have the same electrical property, and the first pulse has a voltage value substantially the same to that of the third pulse.

10 Claims, 14 Drawing Sheets

FORMING METHOD OF RESISTIVE RANDOM-ACCESS MEMORY ARRAY

This application claims the benefit of Taiwan Application Serial No. 112113614 filed at Apr. 12, 2023, the subject matter of which is incorporated herein by reference.

BACKGROUND

Technical Field

The disclosure relates to a controlling method for a memory device, and more particularly to a forming method for a resistive random-access memory (ReRAM) array.

Description of Background

In recent years, with the rise of neural network (NN) systems, such as artificial intelligence (AI) and the Internet of Things (IT), ReRAMs, also known as mersisters, are considered to be one type of the most potential candidate memory devices, because of its advantages of high device density, lower power consumption, fast programming/erasing speed, capable for three-dimensional stacking and can meet the requirements of electrical synapse applications.

In a typical ReRAM device, a pulse voltage is applied to the metal oxide film of the memory device to generate a resistance difference as a basis for judging the states of the stored information. In detailed, before operation, a "forming" step, by which a high voltage is applied to the transition metal oxide or phase change material in the ReRAM to generate conductive filaments, must be performed. Such that, after the forming procedure, when the ReRAM device is subsequently subjected to different pulse voltages, the resistance value of the transition metal oxide or phase change material thereof can be changed between two or more resistance value ranges corresponding to two or more data states (such as, "0" and "1"), serving as the basis for judging the status of the stored information.

However, the ReRAM device is generally in a low resistance state (LR) after forming, which may cause the ReRAM device prone to power supply voltage drop (IR drop) due to leakage. When a plurality of ReRAM units (cells) constituting an RRAM array are subjected to forming procedures, the problem of power supply voltage drop caused by leakage may get worse, as more and more ReRAM units completing the forming; and it will lead to a sharp increase in the failures of the subsequent forming procedures performed on other ReRAM units in the ReRAM array, so as to reduce the operational efficiency of the ReRAM array.

Therefore, there is a need of providing an advanced forming method of the ReRAM array to obviate the drawbacks encountered from the prior art.

SUMMARY

One aspect of the present disclosure is to provide a forming method of a ReRAM array, wherein the method includes steps as follows: Firstly, a first pulse is applied to a first ReRAM unit in the ReRAM array. Afterwards, a second pulse is applied to the first ReRAM unit, wherein the electrical property of the first pulse is opposite to that of the second pulse. Then, a verification pulse is applied to the first ReRAM unit to verify whether the first resistance value of the first ReRAM unit passes a preset threshold. When the first resistance value passes the preset threshold value, a third pulse is applied to the first ReRAM unit, wherein the first pulse and the third pulse have the same electrical property, and the first pulse has a voltage value substantially the same to that of the third pulse.

In accordance with the aforementioned embodiments of the present disclosure, a forming method of a ReRAM array is provided. During the forming procedure on the ReRAM array, a high-voltage pulse and a low-voltage pulse are sequentially applied to each of the ReRAM units constituting the ReRAM array, and after a verification is carried out, another high-voltage pulse is applied to each of the ReRAM units. Such that each of the ReRAM units that is subjected to the forming procedure can be in a high resistance state. Thereby, the leakage current occurring between at least two ReRAM units that are connected in series on the same bit line in the ReRAM array can be reduced, and the problems of power supply voltage drop can be obviated to improve the success rate of the subsequent forming procedures performed on the other ReRAM units of the ReRAM array, and to improve the operation efficiency of the ReRAM array.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

Figure 1A:
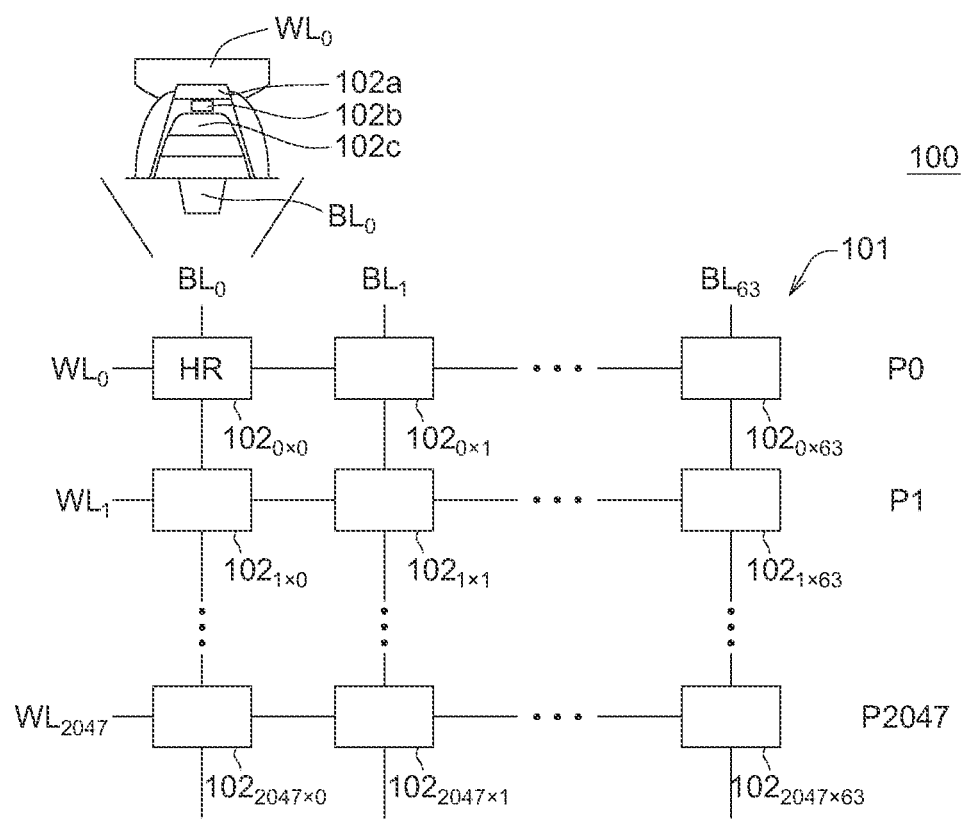
FIG. 1A to FIG. 1E are diagrams illustrating resistance states in different steps during the forming procedures subjected to a plurality of ReRAM units in a ReRAM array, according to one embodiment of the present disclosure.

The embodiments as illustrated below provide a forming method of a ReRAM array, which can improve the operation efficiency of the ReRAM array. The present disclosure will now be described more specifically with reference to the following embodiments illustrating the structure, method and arrangements thereof.

It is to be noted that the following descriptions of preferred embodiments of this disclosure are presented herein for purpose of illustration and description only. It is not intended to be exhaustive or to be limited to the precise form disclosed. Also, it is important to point out that there may be other features, elements, steps, and parameters for implementing the embodiments of the present disclosure which are not specifically illustrated. Thus, the descriptions and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

FIG. 1A to FIG. 1E are diagrams illustrating resistance states in different steps during the forming procedures subjected to a plurality of ReRAM units $102_{0\times0}$-$10_{22047\times63}$ in a ReRAM array 100, according to one embodiment of the present disclosure.

In some embodiments of the present disclosure, the ReRAM array 100 includes at least one block 101, wherein each block 100 includes 131, 9072 ReRAM units $102_{0\times0}$-$102_{2047\times63}$, arranged in a matrix of 2,048 rows×64 columns. Each of the ReRAM units (such as the, ReRAM unit $102_{0\times0}$) includes an upper electrode layer 102a, a memory layer 102b and a lower electrode layer 102c.

The materials constituting the upper electrode layer 102a and the lower electrode layer 102c may be the same or different. For example, in some embodiments of the present disclosure, the materials constituting the upper electrode layer 102a and the lower electrode layer 102c can be selected from a group consisting of tungsten (W), titanium nitride (TiN), tantalum nitride (TaN), copper (Cu), aluminum (Al), gold (Au), silver (Ag), platinum (Pt), titanium (Ti), iridium (Ir) and combinations thereof. In the present embodiment, the upper electrode layer 102a and the lower electrode layer 102c may be respectively made of a composite metal layer composed of TiN/TaN/Pt/Ir.

The material constituting the memory layer 102b can be a transition metal oxide (TMO) or a phase change material. The TMO can be, for example, tantalum oxide (TaOx), titanium oxide, nickel oxide, hafnium oxide (HfOx), zirconium oxide (ZrOx), tungsten oxide (WOx), zinc oxide (ZnOx), aluminum oxide (AlOx), molybdenum oxide (MnOx), copper oxide (CuOx) or any combinations thereof. The phase change material can be, for example, germanium antimony tellurium (GexSbyTez, wherein, x, y and z can be integers, and its chalcogen compounds, such as GST), silver indium antimony tellurium (AgInSbTe) or a combination thereof. In the present embodiment, the memory layer 102b can be a TiOx layer.

In the ReRAM array 100, the plurality of ReRAM units (for example, the ReRAM units $102_{0\times0}$-$102_{0\times63}$) that are disposed in the same row can be connected in series on the corresponding upper electrode layers 102a thereof through a word line (for example, the corresponding one of the word lines $WL_0$-$WL_{2047}$) to form a page (page) $P_0$. The plurality of ReRAM units (for example, the ReRAM units $102_{0\times0}$-$102_{2047\times0}$) that are disposed in the same column can be connected in series on the corresponding lower electrode layers 102c thereof through a bit line (e.g., the corresponding one of the bit lines $BL_0$-$BL_{63}$) to form a string.

Figure 2A:
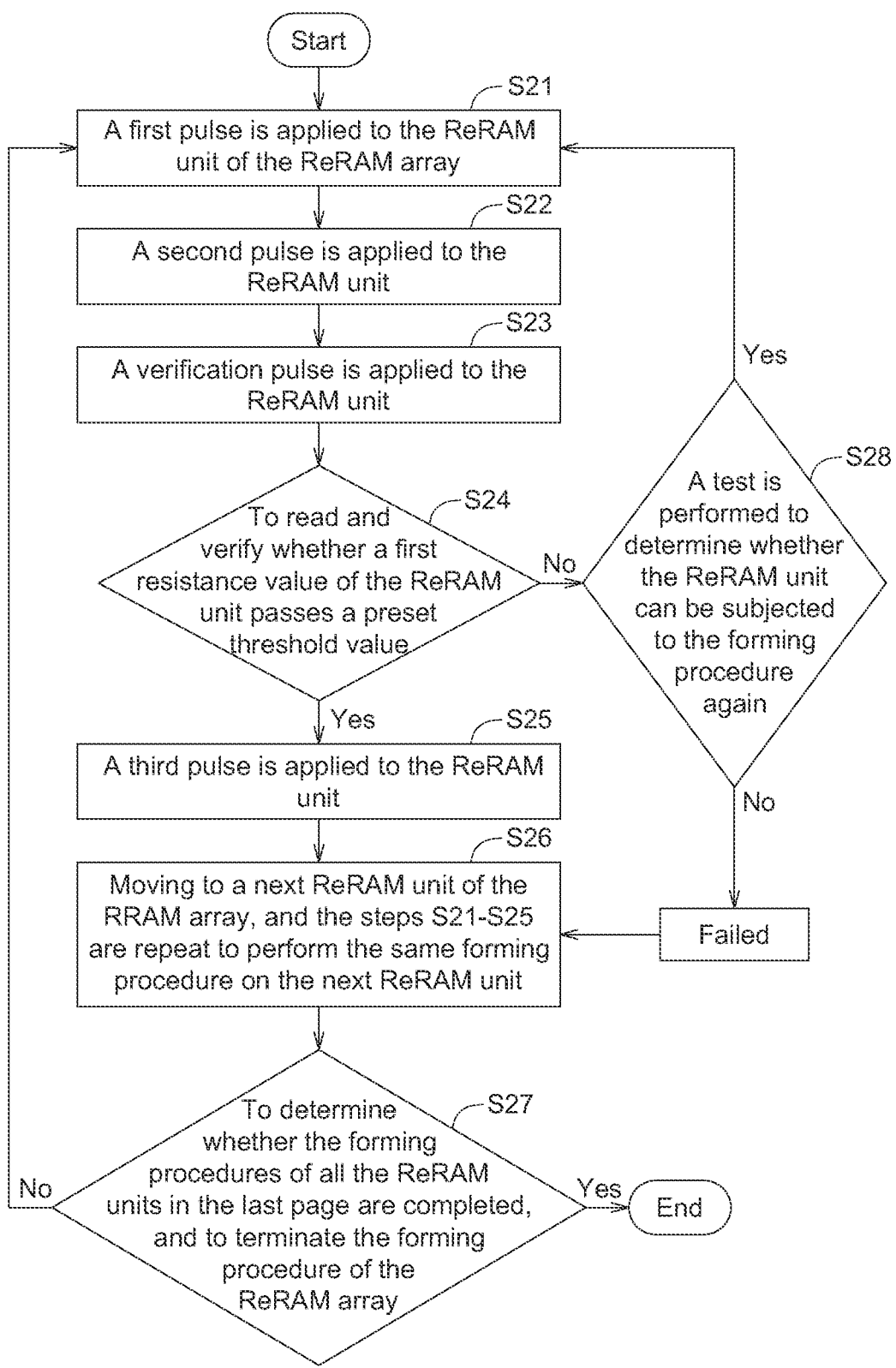
FIG. 2A is a flowchart illustrating the forming method of a ReRAM array, according to one embodiment of the present disclosure.
Figure 2B:
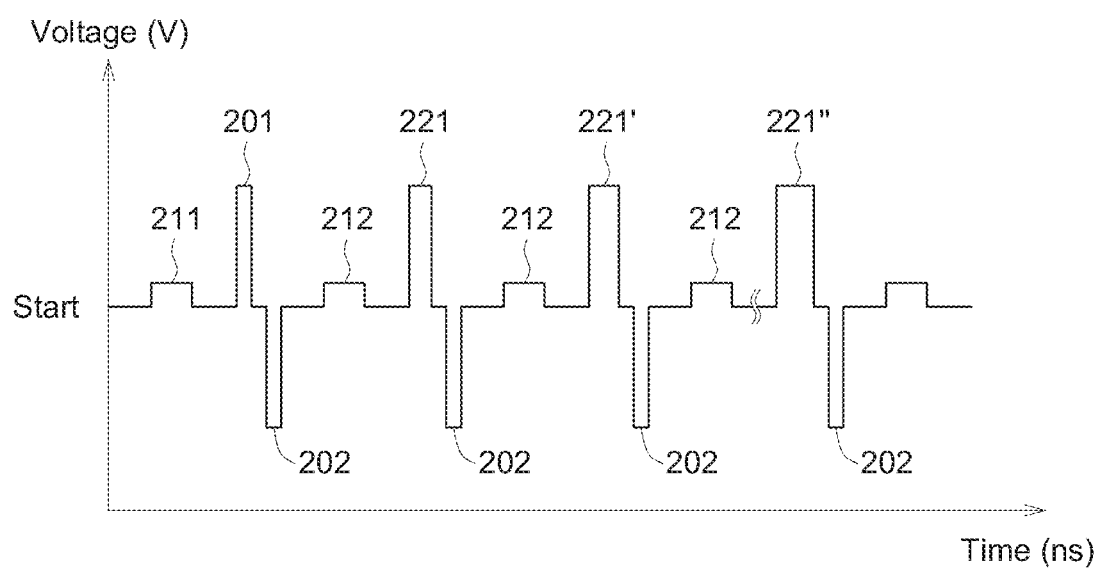
FIG. 2B is a diagram illustrating the pulse waveform of the forming procedure subjected to the ReRAM array, according to one embodiment of the specification.

In some embodiments of the present disclosure, the forming procedure of the ReRAM array 100 is performed individually for each of the plurality of ReRAM units $102_{0\times0}$-$102_{2047\times63}$. For example, FIG. 2A is a flowchart illustrating the forming method of the ReRAM array 100, according to one embodiment of the present disclosure; FIG. 2B is a diagram illustrating the pulse waveform of the forming procedure subjected to the ReRAM array 100, according to one embodiment of the specification.

The forming method of the ReRAM array 100 includes the steps as follows: Firstly, as described in step S21 of FIG. 2A: a first pulse 201 is applied to the ReRAM unit $102_{0\times0}$ of the ReRAM array 100. In the present embodiment, the first pulse 201 may be a forward pulse with a voltage of +3V and a pulse width of 100 nanoseconds (ns). As shown in FIG. 1A, the ReRAM unit $102_{0\times0}$, at the time, is in a high resistance state (HR).

In some embodiments of the present disclosure, before applying the first pulse 201 to the ReRAM unit $102_{0\times0}$, a preparation pulse 211 with a lower absolute voltage value (for example (but not limited to), a forward pulse with a voltage of +0.5V and a pulse width of 200 nanoseconds) may be selectively applied to the ReRAM unit $102_{0\times0}$.

Figure 1B:
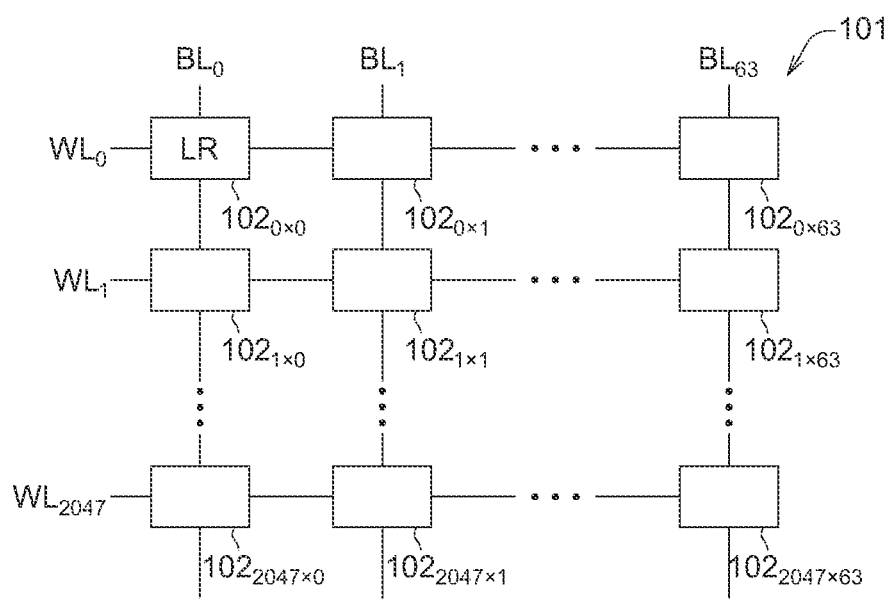

Then, as described in step S22: a second pulse 202 is applied to the ReRAM unit $102_{0\times0}$, wherein the electric property of the first pulse 201 is opposite to that of the second pulse 202. In the present embodiment, the second pulse 202 may be a negative pulse with a voltage of −2.1V and a pulse width of 100 nanoseconds. As shown in FIG. 1B, the ReRAM unit $102_{0\times0}$, at the time, is in a low resistance state (LR).

Figure 1C:
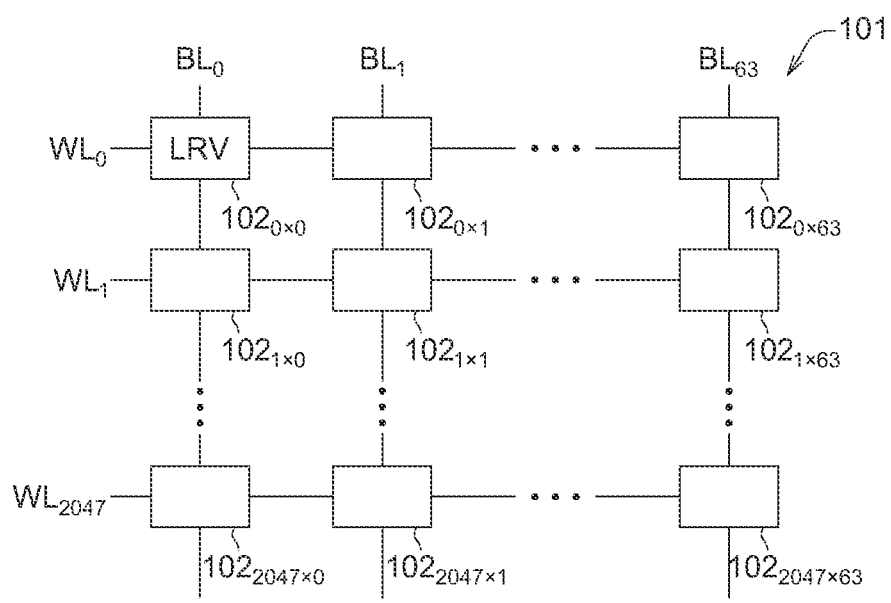

Next, as described in step S23: a verification pulse 212 is applied to the ReRAM unit $102_{0\times0}$, to read and verify whether a first resistance value of the ReRAM unit $102_{0\times0}$ passes a preset threshold value (as described in step S24). In some embodiments of the present disclosure, the absolute voltage value of the verification pulse 212 may be lower than the absolute voltage values of the first pulse 201 and the second pulse 202. For example, in the present embodiment, the verification pulse 212 may be (but not limited to) a forward pulse with a voltage of +0.5V and a pulse width of 200 nanoseconds. As shown in FIG. 1C, the ReRAM unit $102_{0\times0}$, at the time, is still in a relatively low resistance state (LRV).

In some embodiments of the present disclosure, when the verification pulse 212 is applied to the ReRAM unit $102_{0\times0}$, the preset threshold value may be a threshold used to determine, whether the first resistance value is less than 200K ohms, or whether the current passing through the ReRAM unit $102_{0\times0}$ is greater than 2 uA. However, it should be noted that the preset threshold value is not limited thereto. Any physical characteristic that can be used to verify the resistance state of the ReRAM unit $102_{0\times0}$, as the verify pulse 212 is applied to the ReRAM unit $102_{0\times0}$, does not deviate from the spirit of the preset threshold value described herein.

Figure 1D:
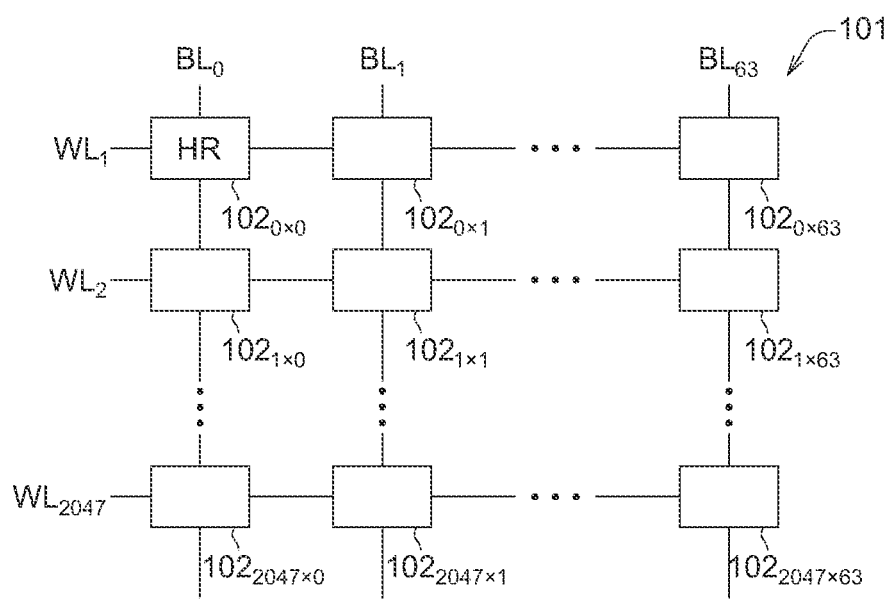

When the step S24 determines that the first resistance value has passed the preset threshold value, a third pulse 221 is applied to the ReRAM unit $102_{0\times0}$ (as described in step S25), wherein the first pulse 201 and the third pulse 221 have the same electrical property and substantially the same voltage value. For example, in the present embodiment, the third pulse 221 may be a forward pulse with a voltage of +3V and a pulse width of 100 nanoseconds. As shown in FIG. 1D, the ReRAM unit $102_{0\times0}$, at the time, is in a high resistance state (HR).

Thereafter as described in step S26: moving to a next ReRAM unit 102 (for example, a ReRAM unit $102_{0\times2}$ that is disposed on the same word line $WL_1$ as the ReRAM unit $102_{0\times0}$) of the RRAM array 100, and the steps S21-S25 are repeat to perform the same forming procedure on the next ReRAM unit $102_{0\times2}$.

Figure 1E:
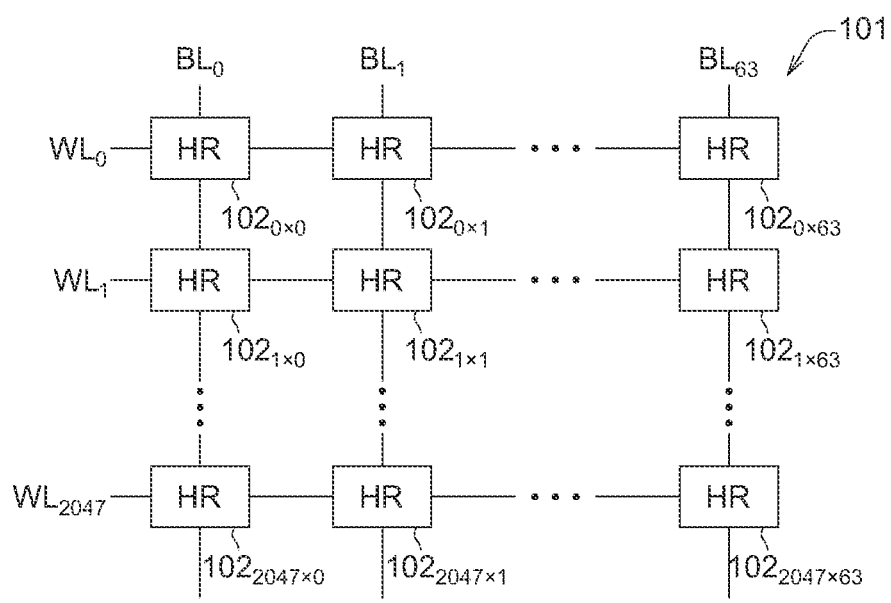

In the present embodiment, after the forming procedures of all the ReRAM units $102_{0\times0}$-$102_{0\times63}$ in page $P_0$ is completed sequentially, the same method can be applied to perform forming procedures on the other ReRAM units $102_{1\times1}$-$102_{2047\times63}$ in other pages $P_1$-$P_{2047}$. When it is determined that the forming procedures of all the ReRAM units $102_{2047\times1}$-$102_{2047\times63}$ in the last page $P_{2047}$ are completed, the forming procedure of the ReRAM array 100 is terminated (as described in step S27). At this time, as shown in FIG. 1E, all of the ReRAM units $102_{0\times0}$-$102_{2047\times63}$ in the ReRAM array 100 are in a high resistance state (HR).

When the step S24 determines that the first resistance value of the ReRAM units $102_{0\times0}$ fails to pass the preset threshold value, a test is performed to determine whether the ReRAM unit $102_{0\times0}$ can be subjected to the forming procedure again (as described in step S28). If the answer of the test is yes (Y), the steps S21-S25 is repeated, and the forming procedure is then performed on the ReRAM units $102_{0\times0}$ again. If the test in step S28 determines that the ReRAM unit $102_{0\times0}$ cannot be subjected to the forming procedure again (the answer of the test is No (N)), the ReRAM unit $102_{0\times0}$ is thus determined as failed.

It should be noted that when step S21 is repeatedly executed, a fourth pulse 221 having the same electrical properties and equal voltage as the first pulse 201 is applied to the ReRAM unit $102_{0\times0}$ (as shown in FIG. 2B). Wherein, the pulse width of the fourth pulse 221 is greater than the pulse width of the first pulse 201. When the step S21 is repeated on the same RRAM unit (for example, ReRAM unit $102_{0\times0}$) for several times, the pulse widths of the fourth pulses 221' and 221" applied on the same ReRAM unit $102_{0\times0}$ will be incremented. For example, in the present embodiment, the pulse widths of the fourth pulses 221, 221' and 221" applied on the same ReRAM unit $102_{0\times0}$ are 200 nanoseconds, 500 nanoseconds and 10 microseconds (µs) respectively.

If the ReRAM unit $102_{0\times0}$ is determined as failed in the step S28, move to the next ReRAM unit 102 (e.g., the ReRAM unit $102_{0\times2}$) of the RRAM array 100, to perform the next forming procedure.

Since at least two ReRAM units (such as, the ReRAM units $102_{0\times0}$ and $102_{1\times0}$), that are disposed in different pages (for example, the pages $P_0$ and $P_1$) of the RRAM array 100 and connected in series to the same bit line (e.g., the bit line BL1), are all in a high resistance state after subjecting to the forming procedure, thus the leakage current occurring on the other ReRAM units (e.g., the ReRAM units $102_{2\times1}$-$102_{2047\times63}$) disposed in other pages $P_2$-$P_{2047}$ can be reduced, wherein the leakage current may be resulted from the forming pulses that are applied to the other ReRAM units (e.g., the ReRAM units $102_{2\times1}$-$102_{2047\times63}$) during the subsequent forming procedures. Such that, the failure probability of the forming procedures performed on the other ReRAM units $102_{2\times1}$-$102_{2047\times63}$ can be reduced, and the operation efficiency of the ReRAM array 100 can be improved.

In addition, due to the operation improvement in the forming procedures, the number of decoders (not shown) configured in the ReRAM array 100 for performing the forming procedures can be reduced under the same load condition. The size of the ReRAM array 100 can be beneficially shrunken without reducing its operation efficiency.

In some embodiments of the present disclosure, the forming procedures subjected to the ReRAM units (e.g., the ReRAM units $102_{0\times0}$-$102_{0\times63}$) disposed in the same page (e.g., the page $P_0$) of the ReRAM array 100 can be performed simultaneously.

FIG. 3A to FIG. 3E are diagrams illustrating resistance states in different steps during the forming procedures subjected to a plurality of ReRAM units $102_{0\times0}$-$102_{2047\times63}$ in a ReRAM array 100, according to another embodiment of the present disclosure; and FIG. 4 is a flowchart of the forming method of a ReRAM array 100, according to another embodiment of the present disclosure.

The forming method of the ReRAM array 100 includes the steps as follows: Firstly, as described in step S41 of FIG. 4A: a first pulse 201 (as shown in FIG. 2A) is applied to a plurality of ReRAM units (e.g., the ReRAM units $102_{0\times0}$-$102_{0\times63}$) in at least one page (e.g., the page $P_0$) of the ReRAM array 100. In the present embodiment, the first pulse 201 may be a forward pulse with a voltage of +3V and a pulse width of 100 nanoseconds (ns).

Figure 3A:
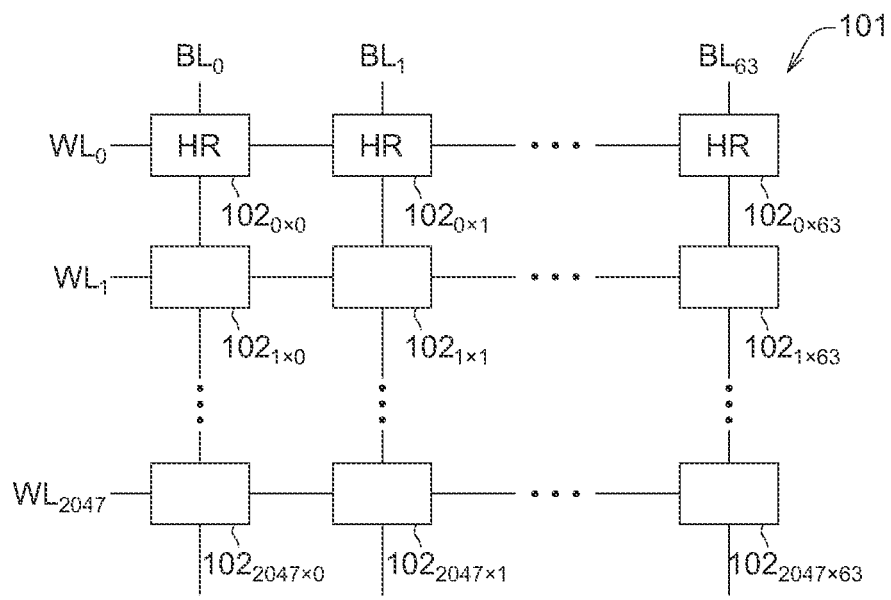
FIG. 3A to FIG. 3E are diagrams illustrating resistance states in different steps during the forming procedures subjected to a plurality of ReRAM units in a ReRAM array, according to another embodiment of the present disclosure.
Figure 3B:
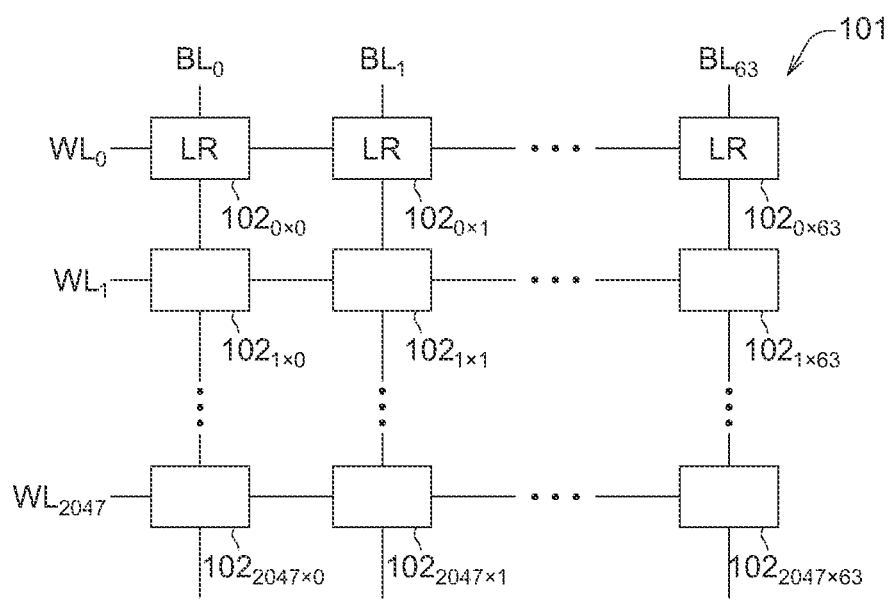
Figure 4A:
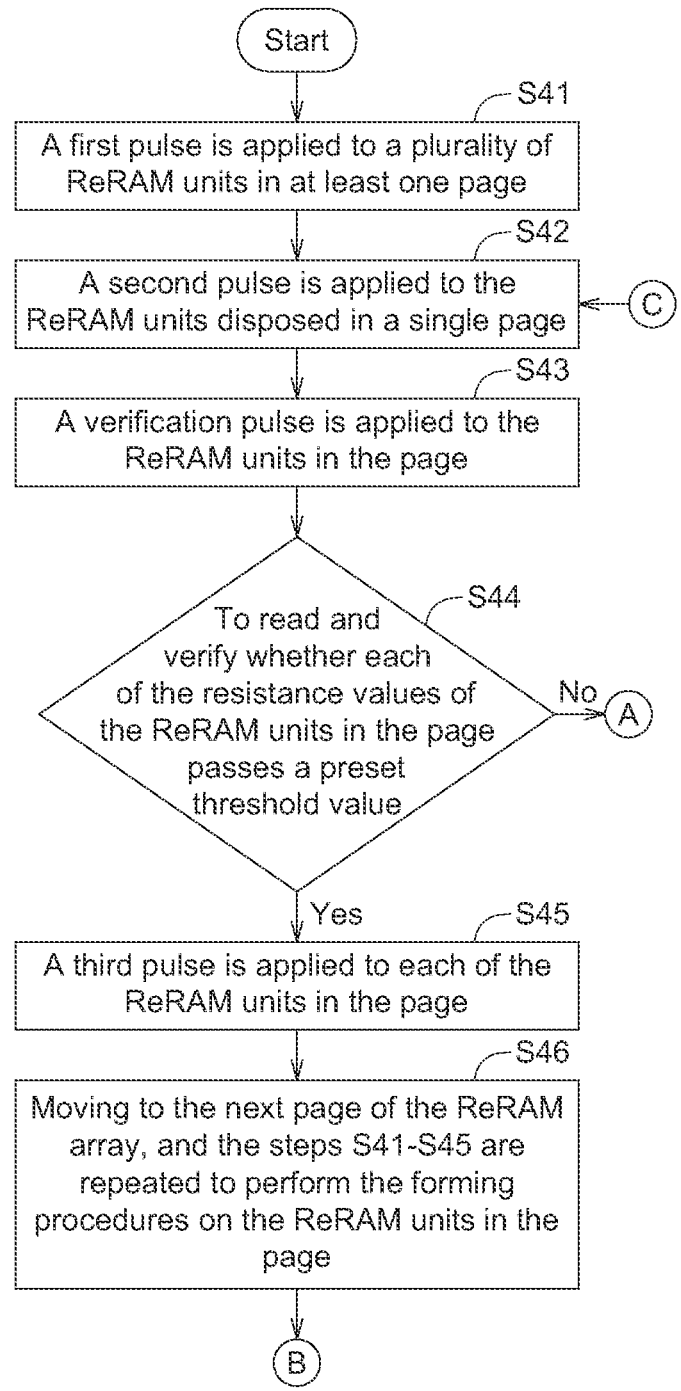
FIG. 4A to 4B are the flowchart of the forming method of a ReRAM array, according to another embodiment of the present disclosure.

In addition, in some embodiments of the present disclosure, it is also possible to apply the first pulse 201 to all of the ReRAM units $102_{0\times0}$-$102_{2047\times63}$ disposed in the same block 101 of the ReRAM array 100. As shown in FIG. 3A, all of the ReRAM units $102_{0\times0}$-$102_{2047\times63}$ disposed in the pages $P_0$-$P_{2047}$, at this time, are in a high resistance state (HR).

Figure 4B:
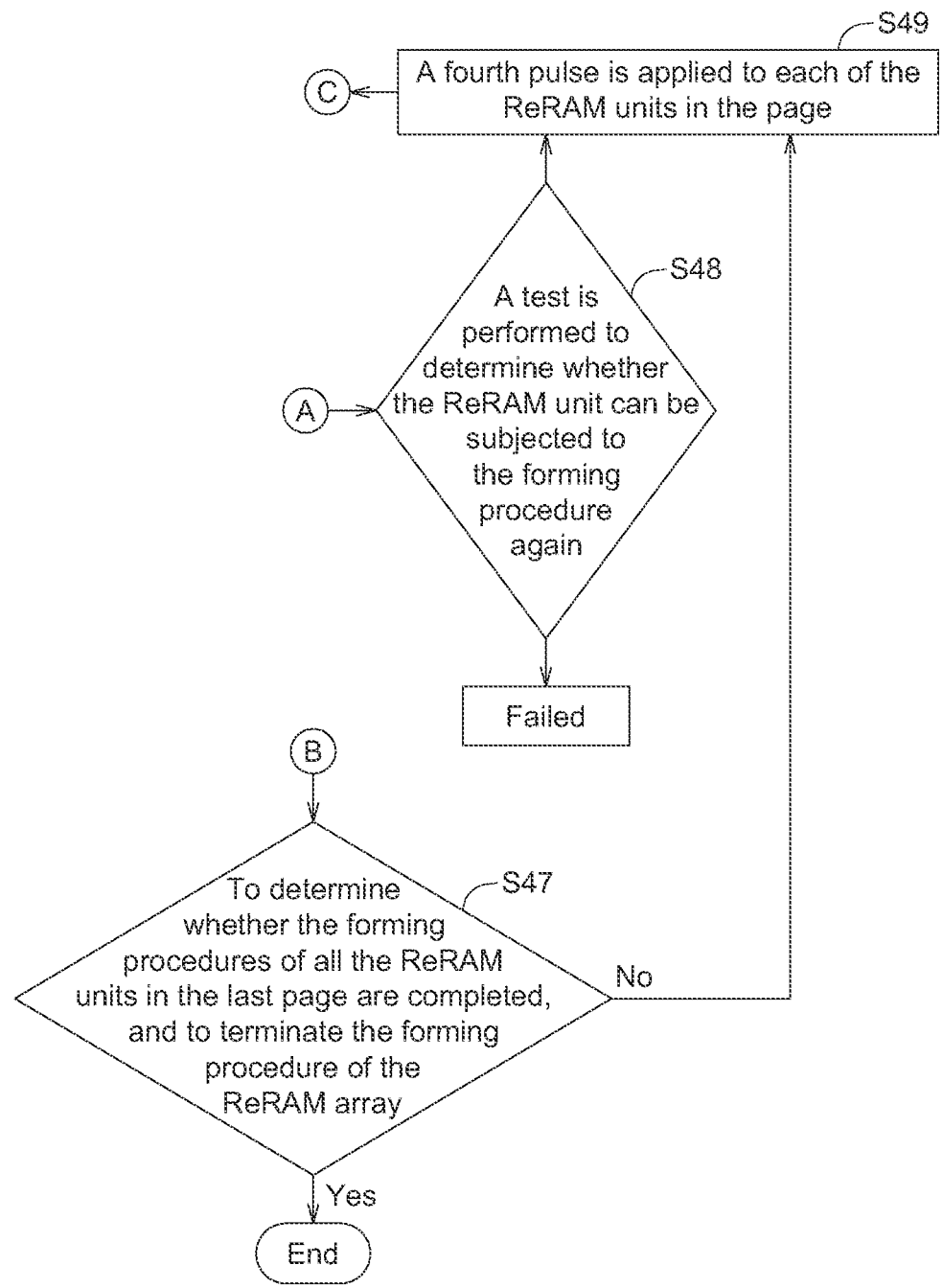

Next, as described in step S42: a second pulse 202 (as shown in FIG. 2B) is applied to the ReRAM units $102_{0\times0}$-$102_{0\times63}$ disposed in a single page (for example, page $P_0$), wherein the electrical property of the first pulse 201 is opposite to that of the second pulse 202. In the present embodiment, the second pulse 202 may be a negative pulse with a voltage of −2.1V and a pulse width of 100 nanoseconds. As shown in FIG. 4B, at this time, the ReRAM units $102_{0\times0}$-$102_{2047\times63}$ in the page $P_0$ are all in a low resistance state (LR).

Figure 3C:
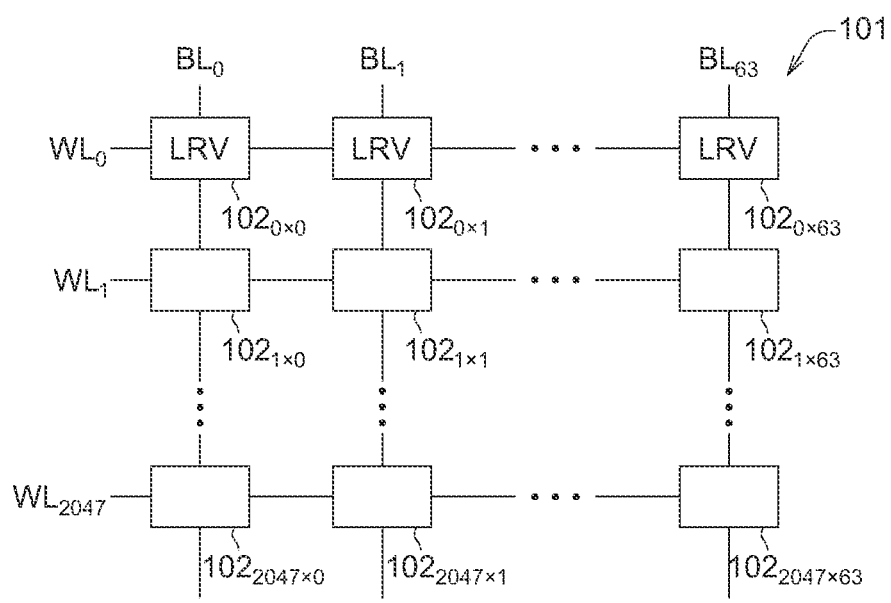

Then, as described in step S43: a verification pulse 212 (as shown in FIG. 2B) is applied to the ReRAM units $102_{0\times0}$-$102_{2047\times63}$ in the page $P_0$ to read and verify whether each of the resistance values of the ReRAM units $102_{0\times0}$-$102_{2047\times63}$ in the page $P_0$ passes a preset threshold value (as described in step S44). For example, in the present embodiment, the verification pulse 212 may be (but not limited to) a forward pulse with a voltage of +0.5V and a pulse width of 200 nanoseconds. As shown in FIG. 3C, the ReRAM units 102 $102_{0\times0}$-$102_{0\times63}$ in the page $P_0$, at the time, is still in a relatively low resistance state (LRV).

Figure 3D:
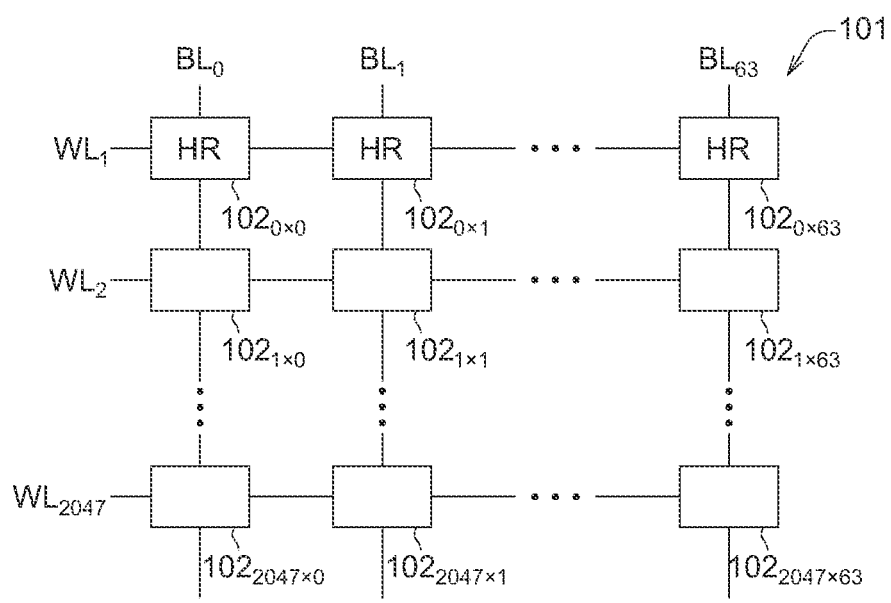

When the step S44 determines that the resistance value of each of the ReRAM units $102_{0\times0}$-$102_{0\times63}$ in the page $P_0$ passes the preset threshold value, a third pulse 221 (as shown in FIG. 2B) is applied to each of the ReRAM units $102_{0\times0}$-$102_{0\times63}$ in the page $P_0$ (as described in step S45), wherein the first pulse 201 and the third pulse 221 have the same electrical property and substantially the same voltage value. For example, in the present embodiment, the third pulse 221 may be a forward pulse with a voltage of +3V and a pulse width of 100 nanoseconds. As shown in FIG. 3D, each of the ReRAM units $102_{0\times0}$-$102_{0\times63}$ in the page $P_0$, at this time, is in a high resistance state (HR).

Figure 3E:
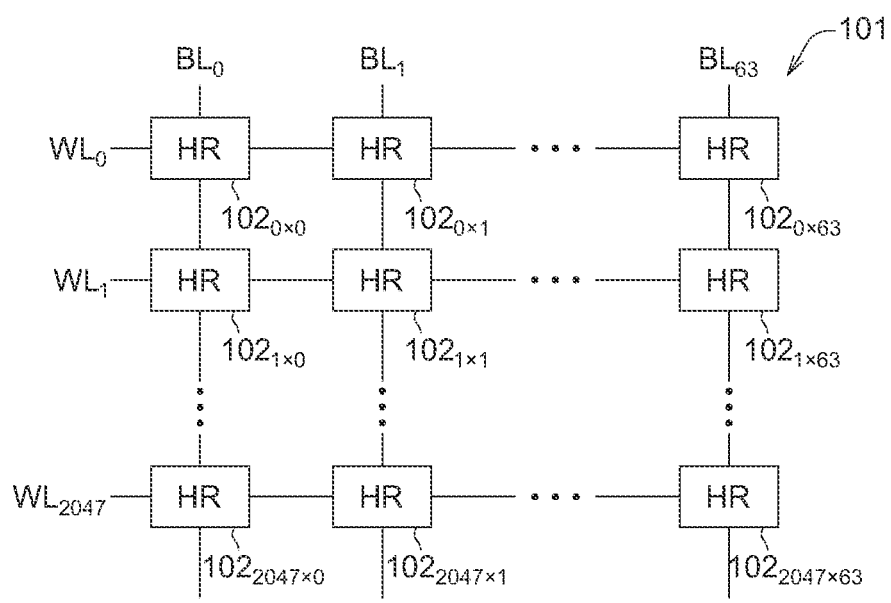

Then, as described in step S46: moving to the next page (for example, page $P_1$) of the ReRAM array 100, and the steps S41-S45 are repeated to perform the forming procedures on the ReRAM units $102_{0\times0}$-$102_{0\times63}$ in the page $P_0$. When it is determined that the forming procedures of all the ReRAM units $102_{2047\times1}$-$102_{2047\times63}$ in the last page $P_{2047}$ are completed, the forming procedure of the ReRAM array 100 is terminated (as described in step S47). At this time, as shown in FIG. 3E, all of the ReRAM units $102_{0\times0}$-$102_{2047\times63}$ in the ReRAM array 100 are in a high resistance state (HR).

When step S44 determines that not all resistance values of the ReRAM units $102_{0\times0}$-$102_{0\times63}$ in the page $P_0$ can pass the preset threshold value, a test is performed to determine whether the ReRAM units $102_{0\times0}$-$102_{2047\times63}$ can be subjected to the forming procedures again (as described in step S48). If the answer of the test is yes (Y), the steps S21-S25 is repeated, and each of the ReRAM units $102_{0\times0}$-$102_{0\times63}$ in the page $P_0$ is then subjected to the forming procedure again.

It is worth to note that when the ReRAM units $102_{0\times0}$-$102_{0\times63}$ in the page $P_0$ are subjected to the forming procedures again, a step S49 can take the place of repeating the step S41, in which merely a fourth pulse 221 is applied to each of the ReRAM units $102_{0\times0}$-$102_{0\times63}$ in the page $P_0$, wherein the fourth pulse 221 has the same electrical property and voltage as the first pulse 201 but with a longer pulse width (as shown in FIG. 2B).

In addition, in some embodiments, when step S44 determines that not all resistance value of the ReRAM units $102_{0\times0}$-$102_{0\times63}$ in the page $P_0$ can pass the preset threshold value, merely the ReRAM unit (for example, the ReRAM unit $102_{0\times63}$) whose resistance value fails to pass the preset threshold value is individually subjected to the forming procedure again, the other ReRAM units $102_{0\times0}$-$102_{0\times6}$ in the page $P_0$ is not subjected to the forming procedure again.

If the test in step S48 determines that the ReRAM units $102_{0\times0}$-$102_{2047\times63}$ in the page $P_0$ cannot be subjected to the forming procedure again (the answer of the test is No (N)), the ReRAM units $102_{0\times0}$-$102_{2047\times63}$ in the page $P_0$ are thus determined as failed. Alternatively, the forming procedure (not shown) as described in FIG. 2A is then performed on each of the ReRAM units $102_{0\times0}$-$102_{2047\times63}$ in the page $P_0$.

Since at least two ReRAM units (such as, the ReRAM units $102_{0\times0}$ and $102_{1\times0}$), that are disposed in different pages (for example, the pages $P_0$ and $P_1$) of the RRAM array 100 and connected in series to the same bit line (e.g., the bit line BL1), are all in a high resistance state after subjecting to the forming procedure, thus the leakage current occurring on the other ReRAM units (e.g., the ReRAM units $102_{2\times1}$-$102_{2047\times63}$) disposed in other pages $P_2$-$P_{2047}$ can be reduced, wherein the leakage current may be resulted from the forming pulses that are applied to the other ReRAM units (e.g., the ReRAM units $102_{1\times1}$-$102_{2047\times63}$) during the subsequent forming procedures. Such that, the failure probability of the forming procedures performed on the other ReRAM units $102_{1\times1}$-$102_{2047\times63}$ can be reduced, and the operation efficiency of the ReRAM array 100 can be improved.

In addition, due to the operation improvement in the forming procedures, the number of decoders (not shown) configured in the ReRAM array 100 for performing the forming procedures can be reduced under the same load condition. The size of the ReRAM array 100 can be beneficially shrunken without reducing its operation efficiency.

In accordance with the aforementioned embodiments of the present disclosure, a forming method of a ReRAM array is provided. During the forming procedure on the ReRAM array, a high-voltage pulse and a low-voltage pulse are sequentially applied to each of the ReRAM units constituting the ReRAM array, and after a verification is carried out, another high-voltage pulse is applied to each of the ReRAM units. Such that each of the ReRAM units that is subjected to the forming procedure can be in a high resistance state. Thereby, the leakage current occurring between at least two ReRAM units that are connected in series on the same bit line in the ReRAM array can be reduced, and the problems of power supply voltage drop can be obviated to improve the success rate of the subsequent forming procedures performed on the other ReRAM units of the ReRAM array, and to improve the operation efficiency of the ReRAM array.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A forming method of a resistive random-access memory (ReRAM) array, comprising:
    applying a first pulse to a first ReRAM unit in the ReRAM array;
    applying a second pulse to the first ReRAM unit, wherein an electrical property of the first pulse is opposite to that of the second pulse;
    applying a verification pulse to the first ReRAM unit to verify whether a first resistance value of the first ReRAM unit passes a preset threshold;
    when the first resistance value passes the preset threshold value, a third pulse is applied to the first ReRAM unit, wherein the first pulse and the third pulse have a same electrical property, and the first pulse has a voltage value substantially the same to that of the third pulse;
    applying the first pulse to a second ReRAM unit in the ReRAM array, wherein the first ReRAM unit and the second ReRAM unit are electrically connected to each other through a bit line;
    applying the second pulse to the second ReRAM unit;
    applying the verify pulse to the second ReRAM unit; and
    when a second resistance value of the second ReRAM unit passes the preset threshold value, the third pulse is applied to the second ReRAM unit.

2. The forming method according to claim 1, before applying the first pulse to the second ReRAM unit, further comprising:
    applying the first pulse to at least one third ReRAM unit in the ReRAM array, wherein the at least one third ReRAM unit and the first ReRAM unit are electrically connected to each other through a word line;
    applying the second pulse to the at least one third ReRAM unit;
    applying the verify pulse to the at least one third ReRAM unit; and
    when the at least one third resistance value of the at least one third ReRAM unit passes the preset threshold value, the third pulse is applied to the at least one third ReRAM unit.

3. The forming method according to claim 2, wherein when the first resistance value fails to pass the preset threshold value, further comprises:
    applying a fourth pulse to the first ReRAM unit, wherein the fourth pulse and the first pulse have the same electrical property and a same voltage value, and the fourth pulse has a pulse width larger than that of the first pulse;
    applying the second pulse to the first ReRAM unit;
    applying the verification pulse to the first ReRAM unit to verify whether a fourth resistance value of the first ReRAM unit passes the preset threshold; and
    when the fourth resistance value passes the preset threshold value, the third pulse is applied to the first ReRAM unit.

4. The forming method according to claim 2, wherein:
    when the first pulse is applied to the first ReRAM unit, the first pulse is simultaneously applied to the at least one third ReRAM unit;
    when the second pulse is applied to the first ReRAM unit, the second pulse is simultaneously applied to the at least one third ReRAM unit; and
    when the third pulse is applied to the first ReRAM unit, the third pulse is simultaneously applied to the at least one third ReRAM unit.

5. The forming method according to claim 4, wherein when one of the first resistance value and the at least one third resistance value fails to pass the preset threshold value:
    applying the first pulse to the first ReRAM unit and the at least one third ReRAM unit, simultaneously;

applying the second pulse to the first RRAM cell and the at least one third RRAM cell, simultaneously;

applying the verification pulse to the first ReRAM unit and the at least one third ReRAM unit, respectively; and when both the first resistance value and the at least one third resistance value pass the preset threshold value, the third pulse is applied simultaneously to the first ReRAM unit and the at least one third ReRAM unit.

6. The forming method according to claim 2, wherein:
when the first pulse is applied to the first ReRAM unit, the first pulse is simultaneously applied to the second ReRAM unit and the at least one third r ReRAM unit;

when the second pulse is applied to the first ReRAM unit, the second pulse is simultaneously applied to the at least one third ReRAM unit; and when the third pulse is applied to the first ReRAM unit, the third pulse is simultaneously applied to the at least one third ReRAM unit.

7. The forming method according to claim 6, wherein when one of the first resistance value and the at least one third resistance value fails to pass the preset threshold value:
applying the first pulse to the first ReRAM unit and the at least one third ReRAM unit, simultaneously;

applying the second pulse to the first ReRAM unit and the at least one third ReRAM unit, simultaneously;

applying the verification pulse to the first ReRAM unit and the at least one third ReRAM unit, respectively;

when both the first resistance value and the third resistance value pass the preset threshold value, the third pulse is applied to the first ReRAM unit and the at least one third ReRAM unit.

8. The forming method according to claim 1, before applying the first pulse to the first ReRAM unit, further comprising: applying a preparation pulse to the first ReRAM unit, wherein the preparation pulse is substantially the same as the verification pulse.

9. The forming method according to claim 1, wherein the verification pulse and the first pulse have the same electrical property, and the verification pulse has a voltage value smaller than that of the first pulse.

10. The forming method according to claim 1, wherein the step of verifying whether the first resistance value passing the preset threshold comprises determining whether the first resistance value is less than 200K ohms, or whether a current passing through the first ReRAM unit is greater than 2uA.

* * * * *